United States Patent [19]

Takizawa

[11] Patent Number: 5,687,270
[45] Date of Patent: Nov. 11, 1997

[54] PHOTODETECTOR MODULE CAPABLE OF PREVENTING DEVIATION OF OPTICAL AXIS

[75] Inventor: Teruo Takizawa, Tokyo, Japan

[73] Assignee: NEC Corporation, Tokyo, Japan

[21] Appl. No.: 547,723

[22] Filed: Oct. 26, 1995

[30] Foreign Application Priority Data

Oct. 27, 1994 [JP] Japan ................... 6-287477

[51] Int. Cl.$^6$ ................................................. G02B 6/36
[52] U.S. Cl. ................... 385/94; 385/93; 385/92; 385/91; 385/88
[58] Field of Search ................... 385/88, 89, 92, 385/93, 94, 49, 14, 33, 34, 35, 91

[56] References Cited

U.S. PATENT DOCUMENTS

| H551 | 12/1988 | Chaoui et al. | 385/90 X |
|---|---|---|---|
| Re. 34,790 | 11/1994 | Musk | 385/93 |
| 4,383,731 | 5/1983 | Simon et al. | 385/93 X |
| 4,433,898 | 2/1984 | Nasiri | 385/93 X |
| 4,479,698 | 10/1984 | Landis et al. | 385/91 X |
| 4,653,847 | 3/1987 | Berg et al. | 385/93 X |
| 4,725,128 | 2/1988 | Bornzin et al. | 385/91 X |
| 4,790,620 | 12/1988 | Niwayama | 385/88 X |
| 5,065,011 | 11/1991 | Fujihara et al. | 250/227.24 |
| 5,247,597 | 9/1993 | Blacha et al. | 385/88 |
| 5,271,079 | 12/1993 | Levinson | 385/46 |
| 5,452,387 | 9/1995 | Chun et al. | 385/88 |

FOREIGN PATENT DOCUMENTS

| 2151817 | 6/1990 | Japan | 385/88 X |
|---|---|---|---|
| 355507 | 3/1991 | Japan | 385/88 X |

*Primary Examiner*—Brian Healy
*Attorney, Agent, or Firm*—Whitham, Curtis, Whitham & McGinn

[57] ABSTRACT

In a photodetector module including a photodetector element and an optical coupling member comprising a ferrule and an optical fiber inserted into the ferrule at a center thereof, a first transparent resin member integrates the photodetector element and the one end of the optical fiber so that the photodetector element and the one end of the optical fiber are embedded therein. A second resin member integrates the optical coupling member and the first transparent resin member so that a part of the optical coupling member and the first transparent resin member are embedded therein. Alternatively, the optical coupling member may comprise a lens member and a lens holder for holding the lens member. In this event, a transparent resin member integrates the photodetector element and the optical coupling member so that the photodetector element and a part of the optical coupling member are embedded therein.

11 Claims, 7 Drawing Sheets

(a)　　　　　(b)

PHOTODETECTOR MODULE CAPABLE OF PREVENTING DEVIATION OF OPTICAL AXIS

BACKGROUND OF THE INVENTION

This invention relates to a photodetector module for use in optical communication or optical measurement.

As a photodetector module, a receptacle type photodetector module is well known in the art. The photodetector module of this type comprises a photodetector element, such as an optical semiconductor element, and an optical coupling member. The optical coupling member is for receiving an optical signal through an outer connector and for supplying the optical signal the photodetector element. For this purpose, the optical coupling member comprises a ferrule and an optical fiber inserted into the ferrule. The optical fiber has one end opposite to the photodetector element with a predetermined gap and another end having an end surface abraded together with one end surface of the ferrule. In other words, the one end of the optical fiber is projected from another end surface of the ferrule while the end surface of the other end in the optical fiber lies in the same plane of the one end of the ferrule.

As will later be described, the one end of the optical fiber opposes the photodetector element in the state that the one end of the optical fiber is mechanically free. For the reason, there is a case that the photodetector module often has a deviation of an optical axis between the optical fiber and the photodetector element. The deviation of the optical axis is caused by mechanical vibration or thermal stress and influences reception sensitivity of the photodetector module.

SUMMARY OF THE INVENTION

It is therefore an object of the present invention to provide a photodetector module capable of preventing deviation of an optical axis between an optical fiber and a photodetector element.

Other objects of the present invention will become clear as the description proceeds.

The present invention is applied to a photodetector module including a photodetector element and an optical coupling member comprising a ferrule and an optical fiber inserted into the ferrule at a center thereof. The optical fiber has one end opposite to the photodetector element with a predetermined gap and has another end which has an end surface abraded together with an end surface of the ferrule. According to an aspect of the present invention, the photodetector module further comprises a first transparent resin member for integrating the photodetector element and the one end of the optical fiber so that the photodetector element and the one end of the optical fiber are embedded therein in a state that the gap is kept between the photodetector element and the one end of the optical fiber, and a second resin member for integrating the optical coupling member and the first transparent resin member so that a part of the optical coupling member and the first transparent resin member are embedded therein.

The present invention is also applied to a photodetector module including a photodetector element and an optical coupling member comprising a lens member and a lens holder for holding the lens member. The photodetector module further comprises a transparent resin member for integrating the photodetector element and the optical coupling member so that the photodetector element and a part of the optical coupling member are embedded therein in a state that a prescribed gap is kept between the photodetector element and the lens member.

DESCRIPTION OF THE PREFERRED EMBODIMENTS

Figure 1:
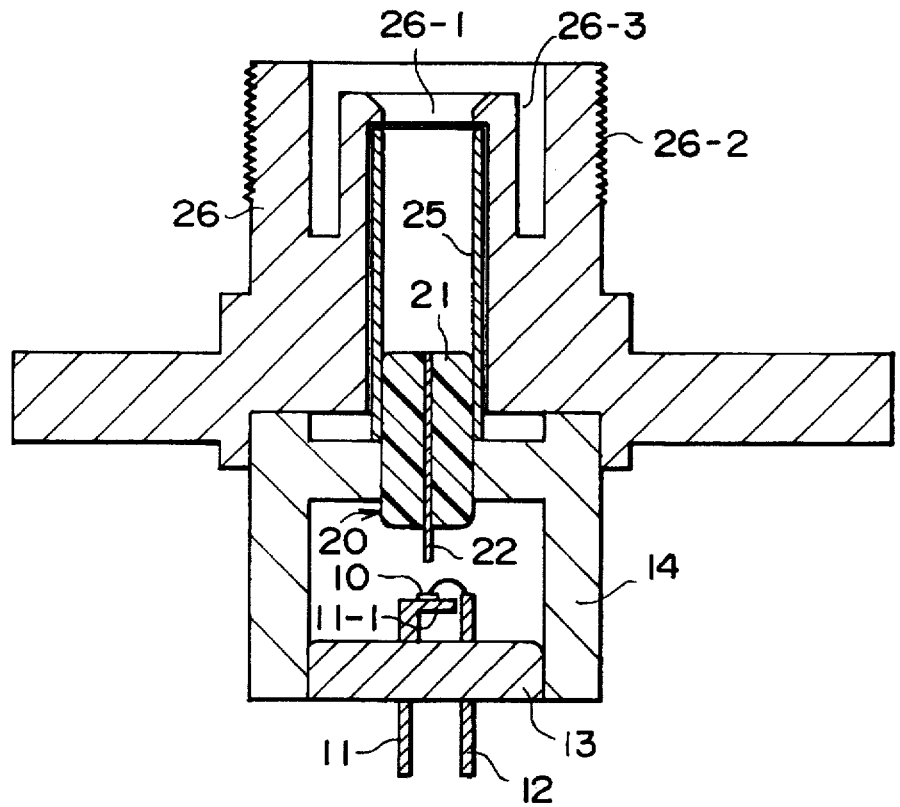
FIG. 1 is a sectional view of a first conventional photodetector module.
Figure 2:
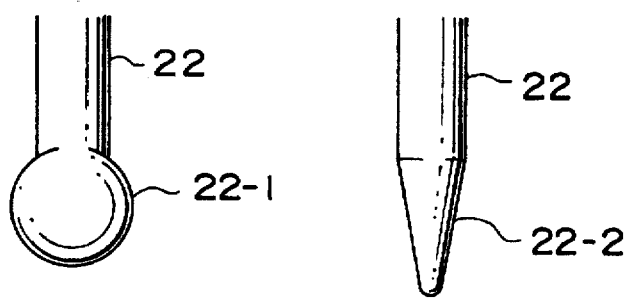
FIGS. 2(a) and 2(b) are enlarged views of an end portion of an optical fiber illustrated in FIG. 1.

Referring to FIGS. 1 and 2, a conventional photodetector module will be described first to facilitate an understanding of the present invention. In FIG. 1, the photodetector module is called a receptacle type and is disclosed in Japanese Unexamined Patent Publication No. 151817/1990 (Tokkai Hei 2-151817). The photodetector module comprises a photodetector element 10, such as an optical semiconductor element, and an optical coupling member 20. The photodetector element 10 is for carrying out photoelectric transfer operations and is mounted on a mount portion 11-1 which is made of a part of a first lead member 11. The photodetector element 10 is electrically connected to the first lead member 11. Furthermore, the photodetector element 10 is electrically connected to a second lead member 12 in the manner referred to as a wire bonding manner. The first and the second lead members 11 and 12 are held by a stem 13. The stem 13 is held by a stem holder 14. The optical coupling member 20 is held by the stem holder 14.

The optical coupling member 20 is for transferring an optical signal to the photodetector element 10. The optical signal is transmitted from an optical signal source through an outer connector (not shown) which is to be connected to the photodetector module. For this purpose, the optical coupling member 20 comprises a ferrule 21 and an optical fiber 22. The optical fiber 22 has one end projected from one end surface of the ferrule 21 and is opposed to the photodetector element 10 with a predetermined gap. The optical fiber 22 further has another end having an end surface abraded together with another end surface of the ferrule 21. Namely, the end surface of the other end in the optical fiber 22 lies in the same plane as the other end of the ferrule 21.

Generally, the one end of the optical fiber 22 has a spherical end 22-1 as illustrated in FIG. 2(a). As shown in FIG. 2(b), the one end of the optical fiber 22 may have a tapered end 22-2 in place of the spherical end.

A part of the optical coupling member 20 is inserted into a sleeve 25. The sleeve 25 is attached to an inner surface of a through hole 26-1 in a receptacle member 26. The receptacle member 26 has a screw portion 26-2 formed on an outer surface thereof and an annular hollow portion 26-3 in order to connect to the outer connector.

For reference, a brief description will be made that regards the outer connector which is suitable for the photodetector module mentioned above, with reference to FIG. 3. The outer connector comprises a connection nut 31, a frame member 32, a ferrule 33, and an optical fiber 34. The connection nut 31 has a hollow portion 31-1 and a screw portion 31-2 formed on an inner surface thereof. The screw portion 31-2 is engaged with the screw portion 26-2 mentioned in conjunction with FIG. 1. The frame member 32 has an annular projection 32-1 to be inserted into the annular hollow portion 26-3 of the receptacle member 26 mentioned with reference to FIG. 1. The ferrule 33 is held by the frame member 32 at a center portion thereof. A part of the ferrule 33 is projected from the annular projection 32-1 in order to insert into the sleeve 25 illustrated in FIG. 1. The optical fiber 34 is connected to the optical signal source (not shown) through a fiber cable 35.

Figure 3:
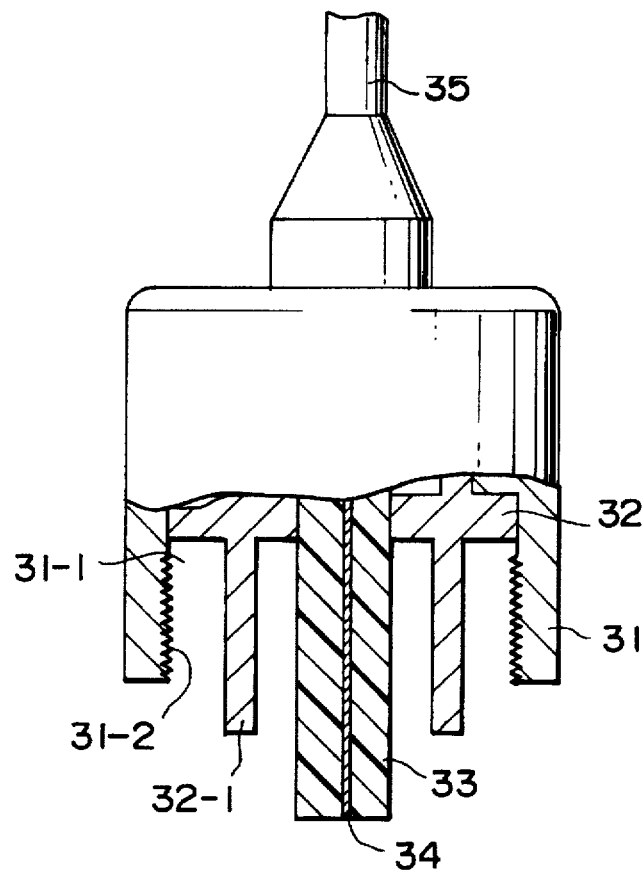
FIG. 3 is a partially sectional view of an outer connector which is applied to the photodetector module illustrated in FIG. 1.

The photodetector module shown in FIG. 1 is connected to the outer connector illustrated in FIG. 3 so that the other end surface of the optical fiber 22 (FIG. 1) contacts with an end surface of the optical fiber 34 (FIG. 3). For this purpose, the end surface of the optical fiber 34 is abraded together with an end surface of the ferrule 33, like the other end surface of the optical fiber 22 mentioned before.

In the photodetector module illustrated in FIG. 1, it is necessary to precisely align an optical axis between the optical fiber 22 and the photodetector element 10. Moreover, there is a case that the photodetector module often has a deviation of the optical axis between the optical fiber 22 and the photodetector element 10. Such a deviation of the optical axis is caused by mechanical vibration or thermal stress. This is because the one end of the optical fiber 22 opposes to the photodetector element 10 in the state that the one end of the optical fiber 22 is mechanically free.

Figure 4:
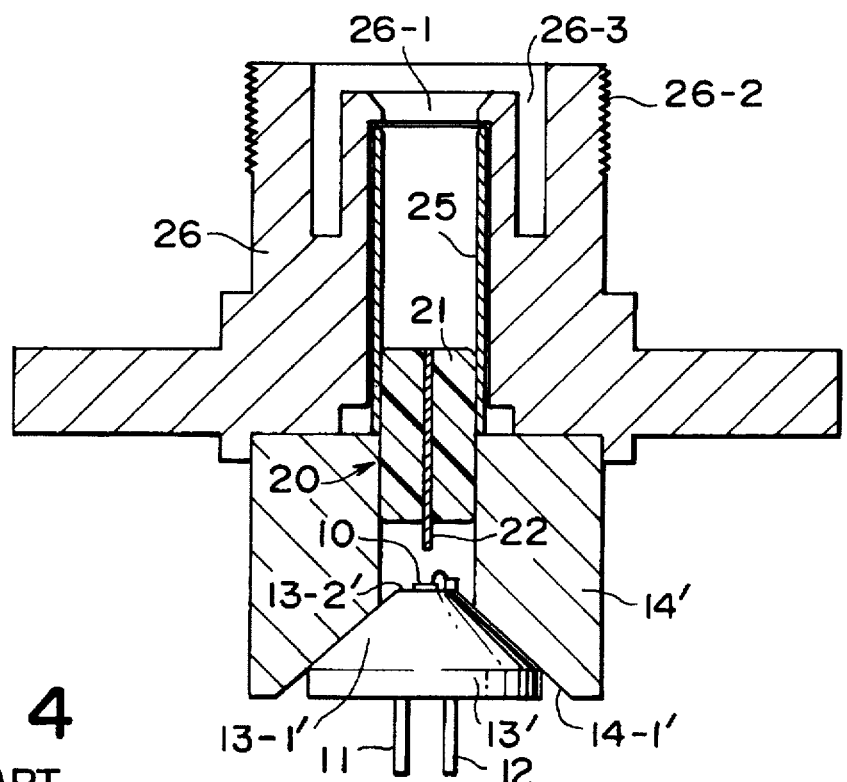
FIG. 4 is a sectional view of a second conventional photodetector module.

Referring to FIG. 4, a description will be made of a second example of the conventional photodetector module which is disclosed in Japanese Unexamined Patent Publication No. 55507/1991 (Tokkai Hei 3-55507). The photodetector module is similar to that illustrated in FIG. 1 except for a stem 13' and a stem holder 14'. In the example, the stem 13' has a cone-shaped portion 13-1' and a flat mount table 13-2' formed at a top portion of the cone-shaped portion 13-1'. The first lead member 11 is inserted into the stem 13' and is electrically connected to the photodetector element 10. The second lead member 12 is also inserted into the stem 13' and is electrically connected to the photodetector element 10 in the same manner as mentioned in conjunction with FIG. 1. The stem holder 14' has an under surface 14-1' which is to be engaged with the cone-shaped portion 13-1'.

In the example, it is possible to carry out alignment of the optical axis between the optical fiber 22 and the photodetector element 10. However, such alignment requires high working accuracy of the stem 13' and the stem holder 14' and high positioning accuracy for mounting the photodetector element 10. Further, there is a case that the photodetector module has a deviation of the optical axis between the optical fiber 22 and the photodetector element 10 for the same reason as described in conjunction with FIG. 1.

Figure 5:
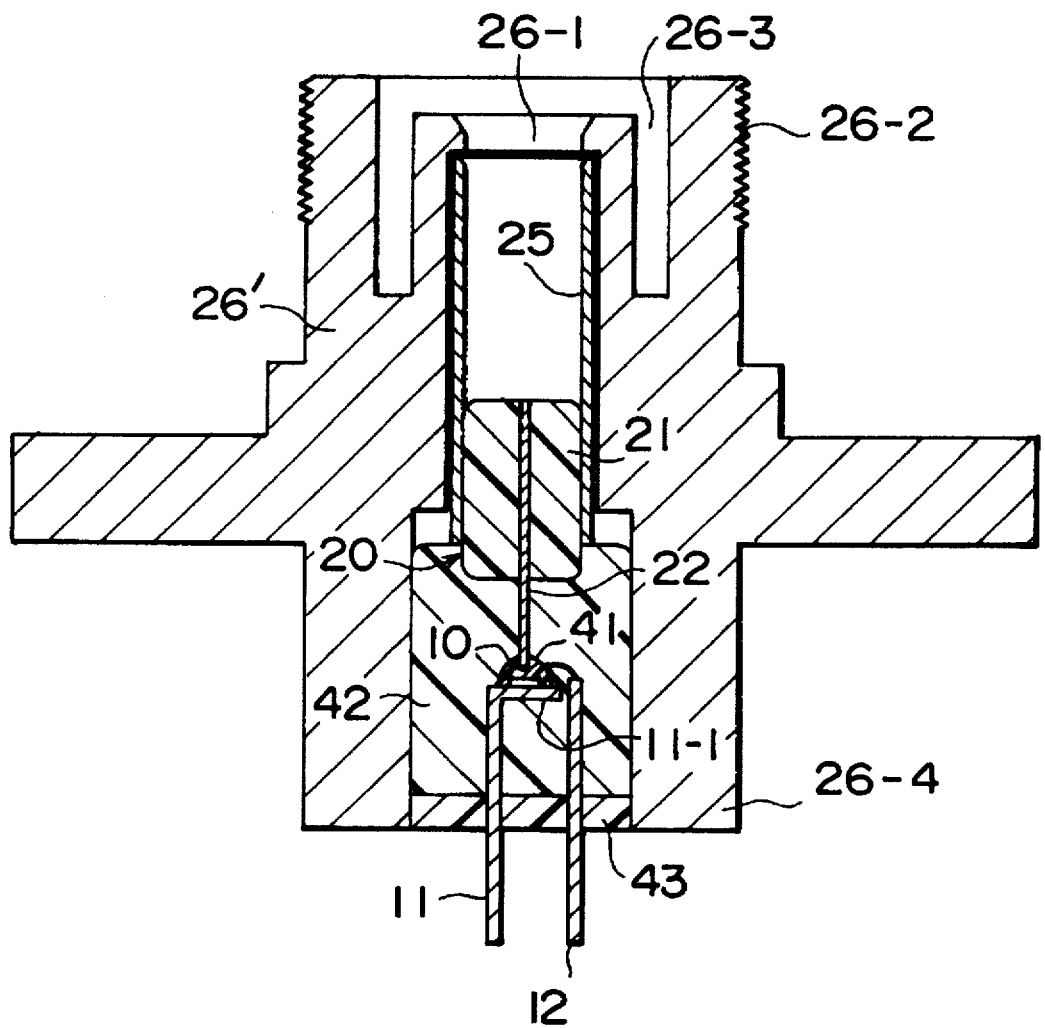
FIG. 5 is a sectional view of a photodetector module according to a first embodiment of this invention.

Referring to FIG. 5, the description will proceed to a photodetector module according to a first embodiment of this invention. The photodetector module comprises similar parts designated by like reference numerals and is called the receptacle type.

In FIG. 5, the photodetector element 10 is mounted on the mount portion 11-1 which is a part of the first lead member 11. The photodetector element 10 is electrically connected to the first lead member 11 and the second lead member 12 in the manner mentioned before. As mentioned in conjunction with FIG. 1, the optical coupling member 20 comprises the ferrule 21 and the optical fiber 22. The optical fiber 22 has the one end projected from one end surface of the ferrule 21 and the other end having the end surface abraded together with the other end surface of the ferrule 21. Although the one end of the optical fiber 22 opposes the photodetector element 10 with the predetermined gap, the one end of the optical fiber 22 and the photodetector element 10 are fixed by a first transparent resin member 41. Furthermore, a part of the ferrule 21, the one end of the optical fiber 22, the photodetector element 10, and a part of each of the first and the second lead members 11 and 12 are fixed by a second transparent resin member 42. Therefore, a combination of the optical coupling member 20, the photodetector element 10, and the first and the second lead members 11 and 12 will be called an inner element.

A receptacle member 26' has an annular holder 26-4 having a hollow portion. The inner element is inserted into the hollow portion of the annular holder 26-4 in the state that a part of the ferrule 21 is inserted into the sleeve 25. A lower end of the annular holder 26-4 is sealed by a seal resin member 43.

Figure 6:
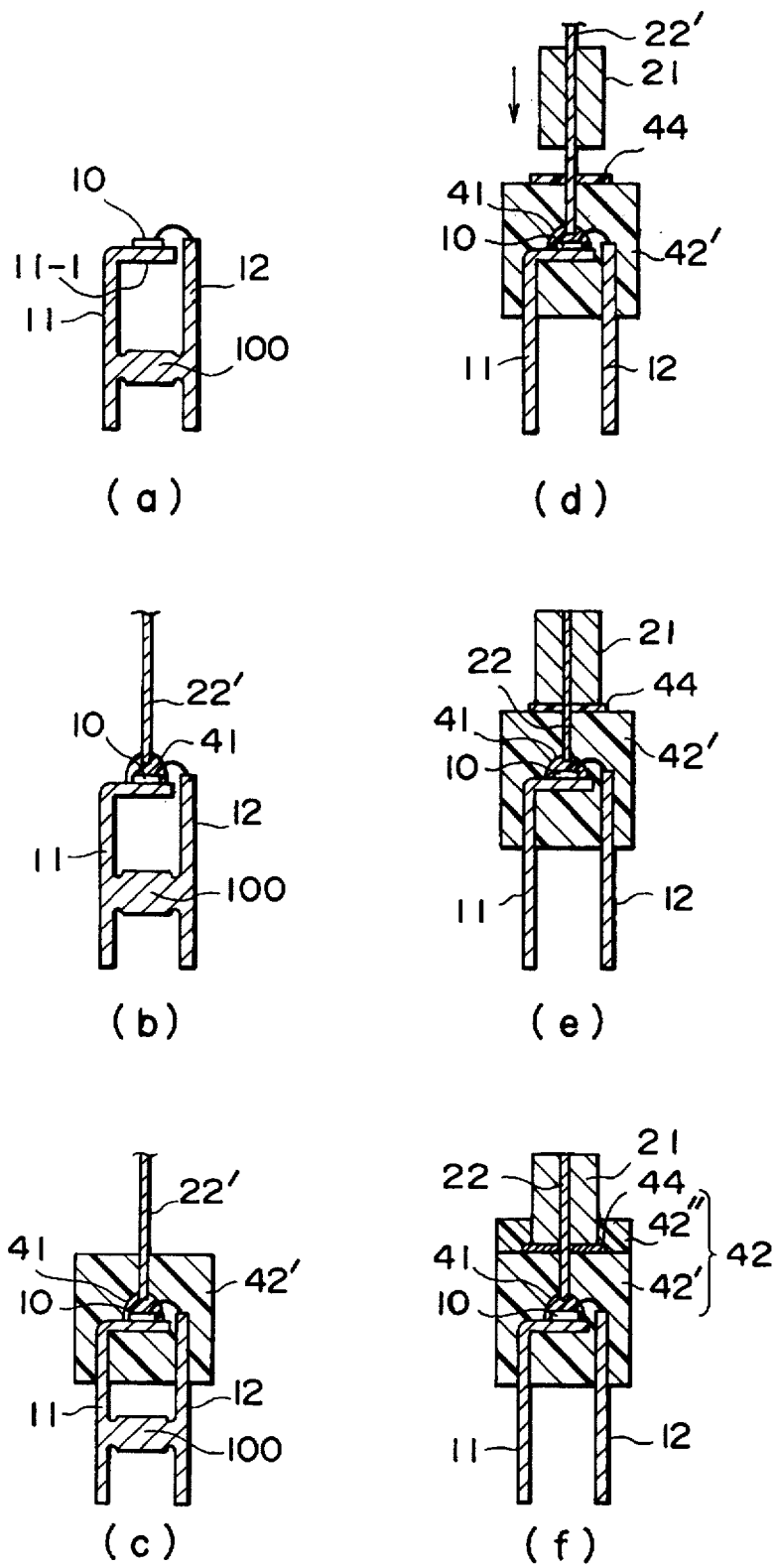
FIGS. 6(a) through 6(f) are views for describing a manufacturing process of an inner element illustrated in FIG. 5.

Referring to FIGS. 6(a) to 6(f), a description will be made regarding a manufacturing method of the inner element. In FIG. 6(a), the first and the second lead members 11 and 12 are provided in the state that those are integrated with a lead frame 100. Then, the photodetector element 10 is mounted on the mount portion 11-1 and is electrically connected to the second lead member 12 in the wire bonding manner.

In FIG. 6(b), an optical fiber 22' is provided. The optical fiber 22' is longer than the optical fiber 22 illustrated in FIG. 5. Then, automatic alignment of an end of the optical fiber 22' is carried out by the use of an image recognition technique known in the art. By the image recognition technique, it is possible to automatically put the end of the optical fiber 22' close to the photodetector element 10 up to 100 (μm). Then, the peak search of a photoelectric current is carried out. In the peak search, an optical signal is supplied to the optical fiber 22'. As a result, the photoelectric current can be obtained from the photodetector element 10. The peak search is carried out stepwise at an interval of 10 (μm) by monitoring the photoelectric current until the end of the optical fiber 22' approaches the photodetector element 10 at a distance equal to 20 (μm). Subsequently, potting treatment is carried out to the end of the optical fiber 22' and the photodetector element 10. Namely, the neighborhood of the optical fiber 22' and the photodetector element 10 is filled with melting transparent resin which serves as the first transparent resin member. As a result of curing of the melting transparent resin, the end of the optical fiber 22' and the photodetector element 10 are fixed by the first transparent resin member 41.

In FIG. 6(c), the photodetector element 10, the first and the second lead members 11 and 12, and a part of the optical fiber 22' are integrally molded by a primary transparent resin member 42'. Then, the lead frame 100 is cut out from the first and the second lead members 11 and 12.

In FIG. 6(d), adhesive 44 is spread on the optical fiber 22' and an upper surface of the primary transparent resin member 42'. Then, the ferrule 21 is attached to the optical fiber 22' and fixed on the upper surface of the primary transparent resin member 42'. In FIG. 6(e), the optical fiber 22' is cut at the end surface of the ferrule 21. As a result, the optical fiber 22' remains as the optical fiber 22. Then, a cutout surface of the optical fiber 22 is abraded together with the end surface of the ferrule 21.

In FIG. 6(f), an upper portion of the primary transparent resin member 42' and a lower portion of the ferrule 21 are molded by a secondary transparent resin member 42" for reinforcing. The secondary transparent resin member 42" is the same material as the primary transparent resin member 42'. Thus, the inner element can be obtained. The primary and the secondary transparent resin members 42' and 42" collectively serve as the second transparent resin member 42 illustrated in FIG. 5. In addition, the first and the second transparent resin members 41 and 42 may be implemented by either ultraviolet curing resin or hot setting resin. Moreover, the second transparent resin member 42 may be an opaque resin.

Turning back to FIG. 5, the sleeve 25 is attached to the ferrule 21 of the inner element. Then, the inner element is attached to the receptacle member 26' so that the sleeve 25 is fixed onto the inner surface of the through hole 26-1 and that the second transparent resin member 42 is fixed onto an inner surface of the hollow portion in the annular holder 26-4. The lower end portion of the annular holder 26-4 is sealed by the seal resin member 43.

Since the photodetector element 10, the optical coupling member 20, and the first and the second lead members 11 and 12 are integrally assembled by the use of the first and the second transparent resin members 41 and 42, the photodetector module can be assembled by attaching the inner element and the receptacle member 26' together with the sleeve 25. This means that it is unnecessary to adjust of the optical axis. Accordingly, there is no restriction of tolerance of each construction member. It is therefore possible to provide the photodetector module at a low cost. Furthermore, it is possible to prevent the deviation of the optical axis between the photodetector element 10 and the optical fiber 22 because the photodetector element 10 and the optical fiber 22 are fixed by the first transparent resin member 41.

Figure 7:
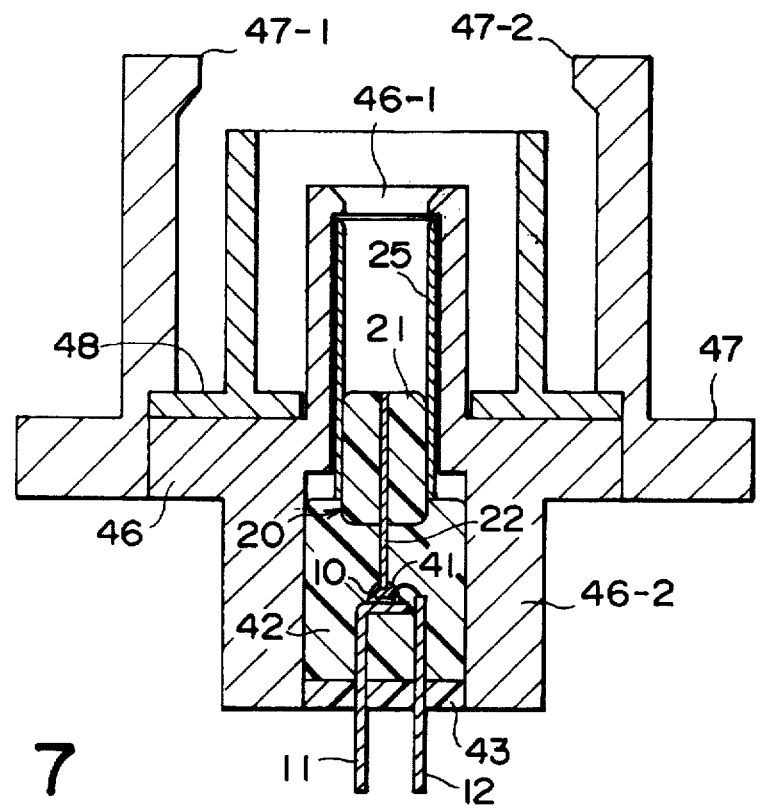
FIG. 7 is a sectional view of a photodetector module according to a second embodiment of this invention.

Referring to FIG. 7, the description will be made as regards a photodetector module according to a second embodiment of this invention. The photodetector module comprises similar parts designated by like reference numerals except that a receptacle member 46, a hook member 47, and a sleeve member 48 are used in place of the receptacle member 26' illustrated in FIG. 5. The receptacle member 46 has a through hole 46-1 for attaching the sleeve 25 and an annular holder 46-2 for holding the inner element which comprises the photodetector element 10, the optical coupling member 20, and the first and the second transparent resin members 41 and 42. The hook member 47 is fixed onto the receptacle member 46 and has two hook portions 47-1 and 47-2 for catching on the outer connector which will shortly be described.

Figure 8:
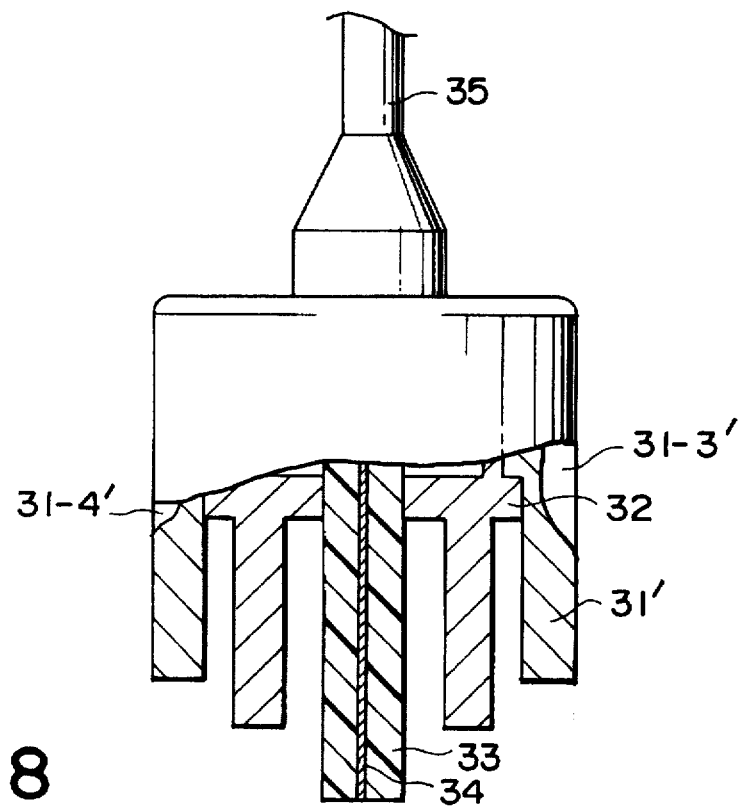
FIG. 8 is a partially sectional view of an outer connector which is applied to the photodetector module illustrated in FIG. 7.

Referring to FIG. 8, an outer connector is applied to the photodetector module shown in FIG. 7 and comprises similar parts illustrated in FIG. 3 except for a connection sleeve member 31'. The connection sleeve member 31' has two recessed portions 31-3' and 31-4' formed on an outer surface thereof. The recessed portions 31-3' and 31-4' are for accepting the two hook portions 47-1 and 47-2 mentioned in FIG. 7 in order to lock the photodetector module to the outer connector.

Figure 9:
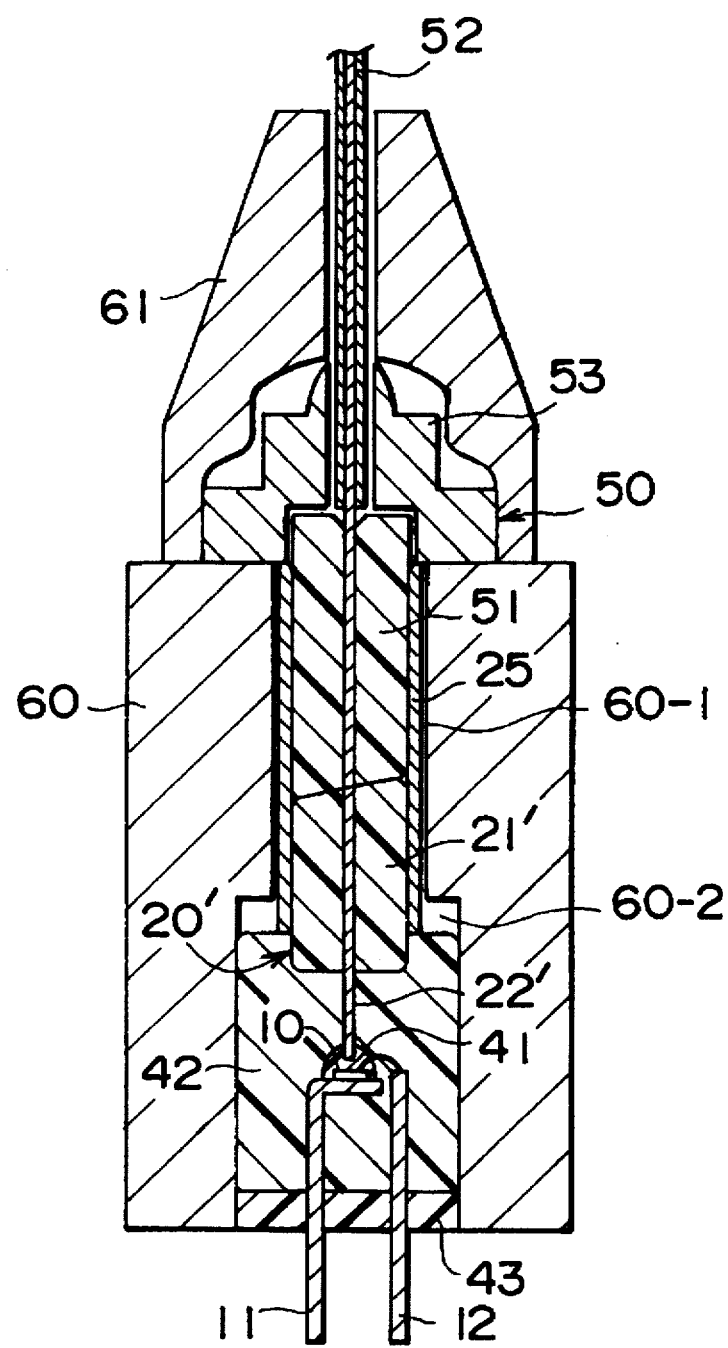
FIG. 9 is a sectional view of a photodetector module according to a third embodiment of this invention.

Referring to FIG. 9, the description will proceed to a photodetector module according to a third embodiment of this invention. The photodetector module is called a coaxial type and is different from that illustrated in FIG. 5 in a point that a simplified ferrule member 50 is used in order to couple to an optical coupling member 20' and that a holder member 60 is used in order to hold the inner element and the simplified ferrule member 50. The holder member 60 has a through hole 60-1 for attaching the sleeve 25 and a hollow portion 60-2 for holding the inner element which comprises the photodetector element 10, the optical coupling member 20', the first and the second transparent resin members 41 and 42. The simplified ferrule member 50 comprises a ferrule 51 wherein an optical fiber 52 is inserted therein. The ferrule 51 is held by a ferrule holder 53. A lower end surface of the ferrule 51 is abraded together with an end surface of the optical fiber 52. It should be noted here that the lower end surface of the ferrule 51 and the end surface of the optical fiber 52 are abraded so that these surfaces have an inclined surface inclined by few degrees. It is desired that those surfaces have the inclined surface inclined by six degrees.

Under the circumstances, the optical coupling member 20' comprises a ferrule 21' and an optical fiber 22' both of which have an inclined surface fitting perfectly with the inclined surface of the lower end surface of the ferrule 51 and the end surface of the optical fiber 52.

The photodetector module is assembled in the following order. The inner element is inserted into the hollow portion 60-2 so that the ferrule 21' is inserted into the sleeve 25. A lower end portion of the hollow portion 60-2 is sealed by the seal resin member 43. Then, the ferrule holder 53 and the holder member 60 are welded at a top surface of the holder member 60 in the state that the ferrule 51 is inserted into the sleeve 25 and that the inclined surface of the optical fiber 52 fits with the inclined surface of the optical fiber 22'. The simplified ferrule member 50 is covered by a nose member 61 wherein the optical fiber 52 passes therethrough.

Figure 10:
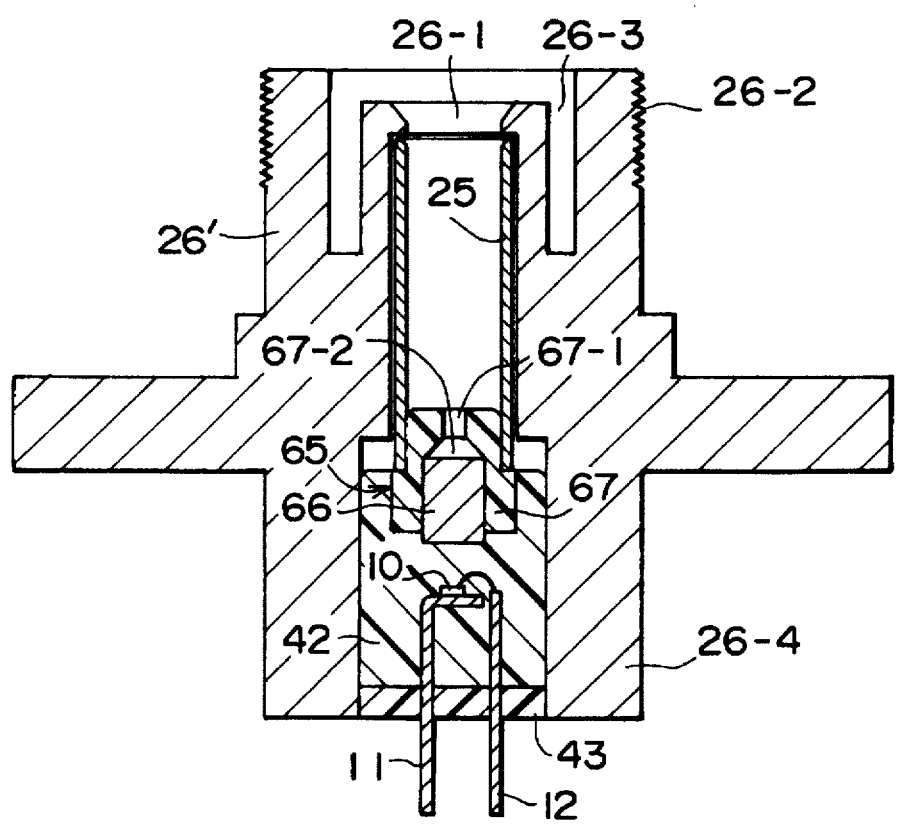
FIG. 10 is a sectional view of a photodetector module according to a fourth embodiment of this invention.

Referring to FIG. 10, the description will be made as regards a photodetector module according to a fourth embodiment of this invention. The photodetector module comprises similar parts designated by like reference numerals except that an optical coupling member 65 is used in place of the optical coupling member 20 and that the first transparent resin member 41 (FIG. 5) is omitted because the optical coupling member 65 does not use the optical fiber 22.

The optical coupling member 65 comprises a self-focusing lens 66 and a lens holder 67. The self-focusing lens 66 opposes the photodetector element 10 with a prescribed gap. The lens holder 67 has a through hole 67-1 for passing the optical signal emitted from the optical fiber of the ferrule included in the outer connector and a hollow portion 67-2 for holding the self-focusing lens 66. In the example, since the optical coupling member 65 does not use the optical fiber, the inner element is assembled by the following manner. Namely, the photodetector element 10, the first and the second lead members 11 and 12, and a lower half of the optical coupling member 65 are integrally molded, as the inner element, by the second transparent resin member 42. Next, an upper half of the optical coupling member 65 is inserted into the sleeve 25. Then, the inner element is inserted into the annular holder 26-4 in the state that the sleeve 25 is inserted into the through hole 26-1. At last, the lower end portion of the annular holder 26-4 is sealed by the seal resin member 43.

Figure 11:
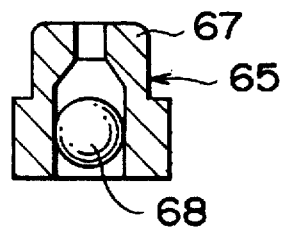
FIG. 11 shows another example of an optical coupling member illustrated in FIG. 10.

Referring to FIG. 11, the optical coupling member 65 may be implemented by the use of a ball lens 68 in place of the self-focusing lens 66 illustrated in FIG. 10.

While this invention has thus far been described in conjunction with few embodiments thereof, it will readily be possible for those skilled in the art to put this invention into practice in various other manners. For example, the receptacle members 26' and 46, the hook member 47, the sleeve member 48, and the holder member 60 may be made of either resin material or metal material.

What is claimed is:

1. A photodetector module including a photodetector element and an optical coupling member comprising a ferrule and an optical fiber inserted into said ferrule at a center thereof, said optical fiber having one end opposite said photodetector element and being separated from said photodetector element by a predetermined gap and having another end which has an end surface abraded together with an end surface of said ferrule, said photodetector module further comprising:

a first transparent resin member for integrating said photodetector element and said one end of the optical fiber such that said photodetector element and said one end of the optical fiber are embedded therein and that said gap is maintained between said photodetector element and said one end of the optical fiber; and a second resin member for integrating said optical coupling member and said first transparent resin member such that a part of said optical coupling member and said first transparent resin member are embedded therein.

2. A photodetector module as claimed in claim 1, wherein said one end of the optical fiber has a spherical end.

3. A photodetector module as claimed in claim 1, wherein said one end of the optical fiber has a tapered end.

4. A photodetector module including a photodetector element and an optical coupling member comprising a lens member and a lens holder for holding said lens member, said photodetector module comprising:

a transparent resin member for integrating said photodetector element and said optical coupling member such that said photodetector element and a part of said optical coupling member are embedded within said transparent resin member and that a prescribed gap is maintained between said photodetector element and said lens member.

5. A photodetector module as claimed in claim 4, wherein said lens member comprises a self-focusing lens.

6. A photodetector module as claimed in claim 4, wherein said lens member comprises a ball lens.

7. A photodetector module as in claim 1, wherein said first transparent resin member maintains an alignment of said photodetector element and said one end of said optical fiber.

8. A photodetector module as in claim 4, wherein said transparent resin member maintains an alignment of said photodetector element and said lens member.

9. A photodetector module comprising:

detecting means for detecting light;

an optical coupling member comprising a ferrule light transmitting means for transmitting light, positioned at a center of said ferrule, separated from said detecting means by a gap; and a solid transparent material connected to said detecting means and said transmitting means such that said gap between said detecting means and said transmitting means is permanently maintained.

10. A photodetector module as in claim 9, further comprising a second resin member for integrating said optical coupling member and said transparent material such that a part of said optical coupling member and said solid transparent material are embedded in said second resin member.

11. A photodetector module comprising:

detecting means for detecting light;

an optical coupling member comprising a ferrule;

light transmitting means for transmitting light, positioned at a center of said ferrule, separated from said detecting means by a gap, said light transmitting means including an end, opposite said detecting means, having an end surface abraded with an end surface of said ferrule; and a solid transparent material connected to said detecting means and said transmitting means such that said gad between said detecting means and said transmitting means is permanently maintained.

* * * * *